(12) United States Patent
Okamura et al.

(10) Patent No.: US 11,925,120 B2
(45) Date of Patent: Mar. 5, 2024

(54) SPINTRONIC DEVICES WITH SELF-COOLING FUNCTION

(71) Applicant: Western Digital Technologies, Inc., San Jose, CA (US)

(72) Inventors: Susumu Okamura, San Jose, CA (US); Christian Kaiser, San Jose, CA (US); Xinjiang Shen, Fremont, CA (US); Yongchul Ahn, San Jose, CA (US); James Mac Freitag, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 334 days.

(21) Appl. No.: 17/387,270

(22) Filed: Jul. 28, 2021

(65) Prior Publication Data

US 2023/0030248 A1 Feb. 2, 2023

(51) Int. Cl.
| | |
|---|---|
| *H10N 10/17* | (2023.01) |
| *G01R 33/09* | (2006.01) |
| *G11B 5/39* | (2006.01) |
| *G11C 11/16* | (2006.01) |
| *H10N 10/82* | (2023.01) |
| *H10N 50/10* | (2023.01) |
| *H10N 50/80* | (2023.01) |
| *H10N 50/85* | (2023.01) |

(52) U.S. Cl.
CPC .......... *H10N 10/17* (2023.02); *G01R 33/093* (2013.01); *G11B 5/3909* (2013.01); *G11C 11/161* (2013.01); *H10N 10/82* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 7,672,088 | B2 | 3/2010 | Zhang et al. |
| 9,007,724 | B1 | 4/2015 | Furukawa et al. |
| 9,666,216 | B1 | 5/2017 | Kobayashi et al. |
| 10,797,227 | B2 | 10/2020 | Le et al. |
| 10,811,034 | B1 | 10/2020 | Wu et al. |

(Continued)

FOREIGN PATENT DOCUMENTS

| | | |
|---|---|---|
| JP | 2018133119 A | 8/2018 |
| WO | 2015126326 A1 | 8/2015 |

OTHER PUBLICATIONS

Ismail et al. (Thermoelectric Devices, submitted to Cond Mat Mat Sci 2014, obtained via https://arxiv.org/. (Year: 2014).*

(Continued)

*Primary Examiner* — Kevin M Bernatz
(74) *Attorney, Agent, or Firm* — PATTERSON + SHERIDAN, LLP; Steven H. Versteeg (57) ABSTRACT

Embodiments of the present disclosure generally relate to spintronic devices, and more specifically to self-cooling spintronic devices. In an embodiment, a device is provided. The device includes a spintronic device having a first side and a second side opposite the first side, a first layer disposed on the first side, and a second layer disposed on the second side, the first layer having a Seebeck coefficient that is different from a Seebeck coefficient of the second layer.

29 Claims, 7 Drawing Sheets

(56) References Cited

U.S. PATENT DOCUMENTS

| | | | |
|---|---|---|---|
| 10,885,933 B2* | 1/2021 | Li | G11B 5/21 |
| 2004/0233584 A1* | 11/2004 | Liu | G11B 5/3912 |
| | | | 360/324.1 |
| 2006/0056113 A1* | 3/2006 | Fukushima | G11B 5/40 |
| | | | 360/324.1 |
| 2007/0008656 A1* | 1/2007 | Liu | G11B 5/3133 |
| 2008/0150643 A1 | 6/2008 | Suzuki et al. | |
| 2014/0160598 A1* | 6/2014 | Takashita | G11B 5/3136 |
| | | | 360/234.3 |

OTHER PUBLICATIONS

International Search Report and Written Opinion for International Application No. PCT/US2022/027358 dated Jul. 28, 2022.

Le Breton et al., "Thermal spin current from a ferromagnet to silicon by Seebeck spin tunnelling", Nature, vol. 475, Jul. 7, 2011, pp. 82-85.

Flipse et al., "Cooling and heating with electron spins: Observation of the spin Peltier effect", Zernike Institute for Advanced Materials, University of Groningen, 9747 AG Groningen, The Netherlands, 22 pages.

Takata, Fumiya et al., "Negative anisotropic magnetoresistance resulting from minority spin transport in NixFe4-xN (x = 1 and 3) epitaxial films", Journal of Applied Physics, 2017, vol. 121, Issue 2, p. 023903-1 to 023903-5.

Yoshida, Kazuetsu et al., "Spin Torque Oscillator With Negative Magnetic Anisotropy Materials for Mamr", IEEE Transactions on Magnetics, vol. 46, No. 6, Jun. 2010, pp. 2466-2469.

Chung, H. J. et al., "Co/Fe multilayers with ultra-low damping and large negative anisotropy as the free layer for spin torque oscillator", Applied Physics Letters, vol. 109, Issue 18, 2016, p. 182401-1 to 182401-5.

Dogane, Mikihiko et al., "Low magnetic damping and large negative anisotropic magnetoresistance in halfmetallic Co2-xMn1+xSi Heusler alloy films grown by molecular beam epitaxy", Applied Phyiscs Letters, vol. 112, Issue 26, 2018, p. 262407-1 to 262407-5.

Zhang, Mingsheng et al., "Analysis of Switchable Spin Torque Oscillator for Microwave Assisted Magnetic Recording", Advances in Condensed Matter Physics, vol. 2015, Mar. 2015, pp. 1-8.

* cited by examiner

SPINTRONIC DEVICES WITH SELF-COOLING FUNCTION

BACKGROUND OF THE DISCLOSURE

Field of the Disclosure

Embodiments of the present disclosure generally relate to spintronic devices, and more specifically to self-cooling spintronic devices.

Description of the Related Art

Spintronic devices utilize electrons to process, transmit, and store information and find use in various devices such as sensors utilized in magnetic recording heads. Materials utilized in spintronic devices typically include a top lead and a bottom lead that supply a current or electron flow through the spintronic device. This current or electron flow causes joule heating, e.g., a temperature rise, in the device, resulting in poor lifetime and reliability of spintronic devices.

To combat the temperature rise, state-of-the-art methods reduce the current flow flowing through the device or reduce the volume of the spin polarizing layer. Such methods, however, sacrifice areal density capability (ADC) gains of magnetic recording. Alternatively, a thermally conductive material can be placed near the device for heat dissipation. However, this additional represents a manufacturing hurdle in terms of, e.g., increased costs and engineering. Moreover, such conventional solutions do not effectively mitigate the temperature rise as is needed to substantially improve the longevity of spintronic devices.

There is a need for spintronic devices that overcome these and other deficiencies.

SUMMARY OF THE DISCLOSURE

Embodiments of the present disclosure generally relate to spintronic devices, and more specifically to self-cooling spintronic devices.

In an embodiment, a device is provided. The device includes a spintronic device having a first side and a second side opposite the first side, a first layer disposed on the first side, and a second layer disposed on the second side, the first layer having a Seebeck coefficient that is different from a Seebeck coefficient of the second layer.

In another embodiment, a device is provided that includes a bottom lead and a spintronic oscillator (STO) disposed over the bottom lead. The device further includes a top lead disposed over the spintronic oscillator, and a first layer, the first layer disposed between the bottom lead and the STO or disposed between the top lead and the STO, wherein the device is configured to self-cool when a current is applied to the device.

In another embodiment, a device is provided that includes a bottom lead, a spintronic device disposed over the bottom lead, the spintronic device comprising a spintronic oscillator (STO), a spin-orbit torque (SOT) device, a magnetic tunnel junction (MTJ), or a current-perpendicular-to-plane giant magnetoresistance (CPP-GMR) device. The device further includes a top lead disposed over the spintronic device, and a first layer, the first layer disposed between the bottom lead and the spintronic device or disposed between the top lead and the spintronic device, wherein the device is configured to self-cool when a current is applied to the device.

In another embodiment, a spintronic device is provided. The spintronic device includes a bottom lead; a first layer disposed over the bottom lead, the first layer having a Seebeck coefficient; and a spintronic oscillator (STO) disposed over the first layer, the spintronic oscillator having a width of about 10 nm to about 100 nm. The spintronic device further includes a second layer disposed over the STO, the second layer having a Seebeck coefficient, the Seebeck coefficient of the second layer being different from the Seebeck coefficient of the first layer; and a top lead disposed over the second layer, wherein the first layer and the second layer are positioned about the STO such that electrons flow from the layer having a higher Seebeck coefficient to the layer having a lower Seebeck coefficient when a current is applied to the spintronic device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to spintronic devices, and more specifically to self-cooling spintronic devices. The inventors have found that use of materials/layers, having differing Seebeck coefficients, within the spintronic devices enables suppression of joule heating in the spintronic devices, and improves the lifetime and reliability of the devices. Briefly, insertion of a material having a lower Seebeck coefficient on one side of a spintronic oscillator and/or insertion of a material having a higher Seebeck coefficient on an opposite side of the spintronic oscillator enables, e.g., a thermoelectric Peltier cooling effect of the spintronic device during electron flow. As a non-limiting illustration, this self-cooling effect is observed by utilizing a cobalt-containing layer (which has a relatively lower Seebeck coefficient) below the trailing shield (or top lead) and a chromium-containing layer (which has a relatively higher Seebeck coefficient) above the main pole (or bottom lead). Here, the self-cooling effect is a result of, e.g., the electrons flowing from the layer having a higher Seebeck coefficient to the layer having a lower Seebeck coefficient. Positioning of the layer(s) in various location(s) are described and contemplated to enable the self-cooling effect.

Materials typically utilized for spintronic devices have certain Seebeck coefficients, but typical materials, e.g., Ru, Ta, used in seed layer has a near-zero Seebeck coefficient. Embodiments described herein, as discussed, include, e.g., a layer or layers having large positive and/or large negative Seebeck coefficients.

The inventors have also found that the cooling effect can be achieved using tapered materials/layers. For example, and in some embodiments, the cooling effect is observed when a tapered layer having a Seebeck coefficient inserted above the main pole (or bottom lead) and/or below the trailing shield (or top lead).

It is to be understood that the embodiments discussed herein are applicable to a data storage device such as a hard disk drive (HDD) as well as a tape drive such as a tape embedded drive (TED) or an insertable tape media drive such as those made according to Linear Tape Open (LTO) standards. An example TED is described in co-pending patent application titled "Tape Embedded Drive," United States Publication. No. 2020/0258544, filed Mar. 26, 2019, assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

It is also to be understood that embodiments disclosed herein, such as the magnetoresistive devices, may be used in magnetic sensor applications outside of HDDs and tape media drives such as TEDs, such as spintronic devices other than HDDs and tape media drives. As an additional example, embodiments disclosed herein may be used in magnetic elements in magnetoresistive random-access memory (MRAM) devices (e.g., magnetic tunnel junctions as part of memory elements), magnetic sensors or other spintronic devices.

It is also to be understood that embodiments disclosed herein may be used with those multilayer structures having a negative spin polarization and a negative anisotropic field, as well as other structures, as disclosed in U.S. patent application Ser. No. 17/210,073, filed Mar. 23, 2021, assigned to the same assignee of this application, which is herein incorporated by reference in its entirety.

Figure 1:
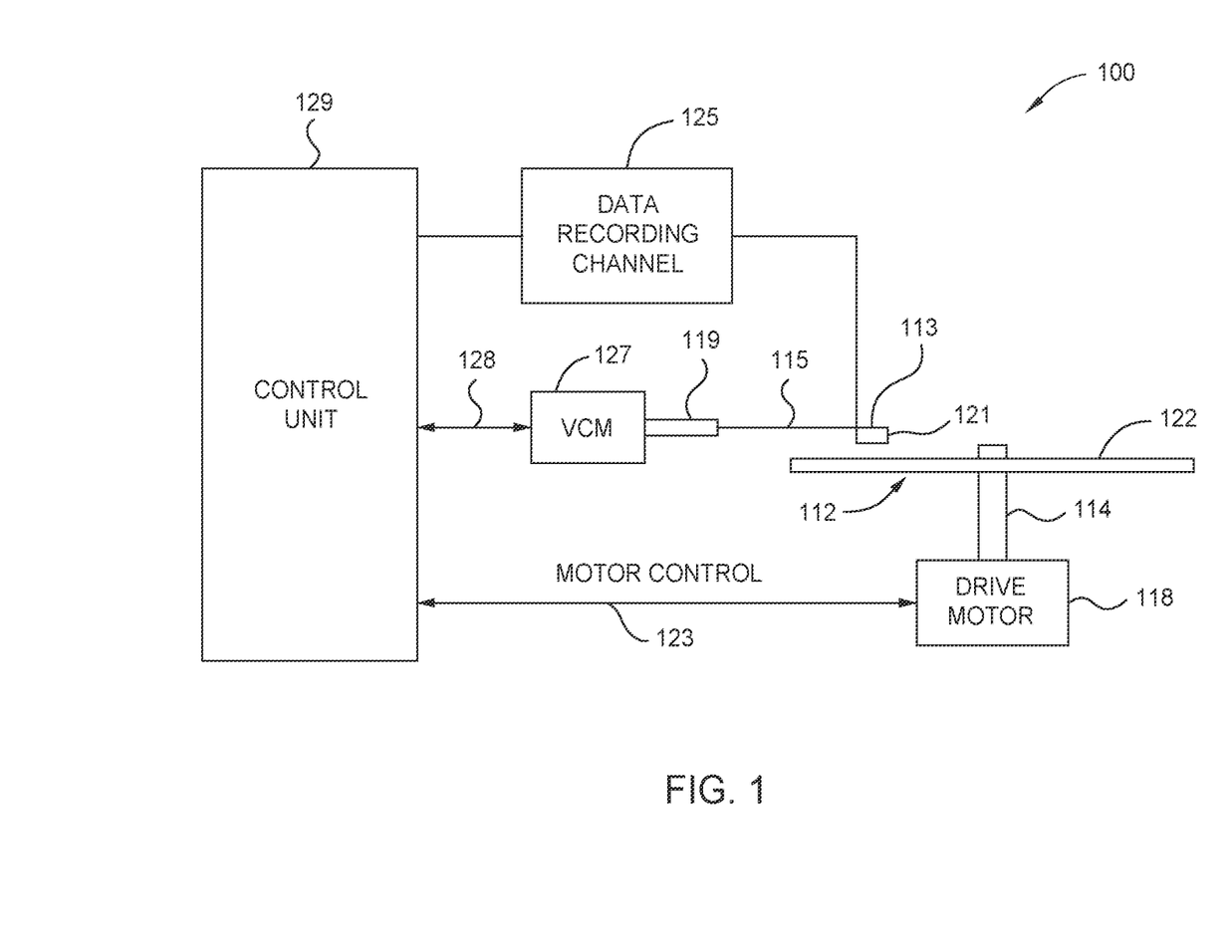
FIG. 1 illustrates a magnetic recording device embodying this disclosure.

FIG. 1 illustrates a magnetic recording device 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force that biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction, and speed of the coil movements being controlled by the motor current signals supplied by control unit 129.

During operation of the magnetic recording device 100, the rotation of the magnetic media 112 generates an air bearing between the slider 113 and the media surface 122 that exerts an upward force or lift on the slider 113. The air bearing thus counter-balances the slight spring force of suspension 115 and supports slider 113 off and slightly above the magnetic media 112 surface by a small, substantially constant spacing during normal operation. In the case of EAMR, a DC magnetic field generated from an assist element of the magnetic head assembly 121 enhances the write-ability so that the write element of the magnetic head assembly 121 may efficiently magnetize the data bits in the magnetic media 112.

The various components of the magnetic recording device 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position the slider 113 to the desired data track on the magnetic media 112. Write and read signals are communicated to and from write and read heads on the magnetic head assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
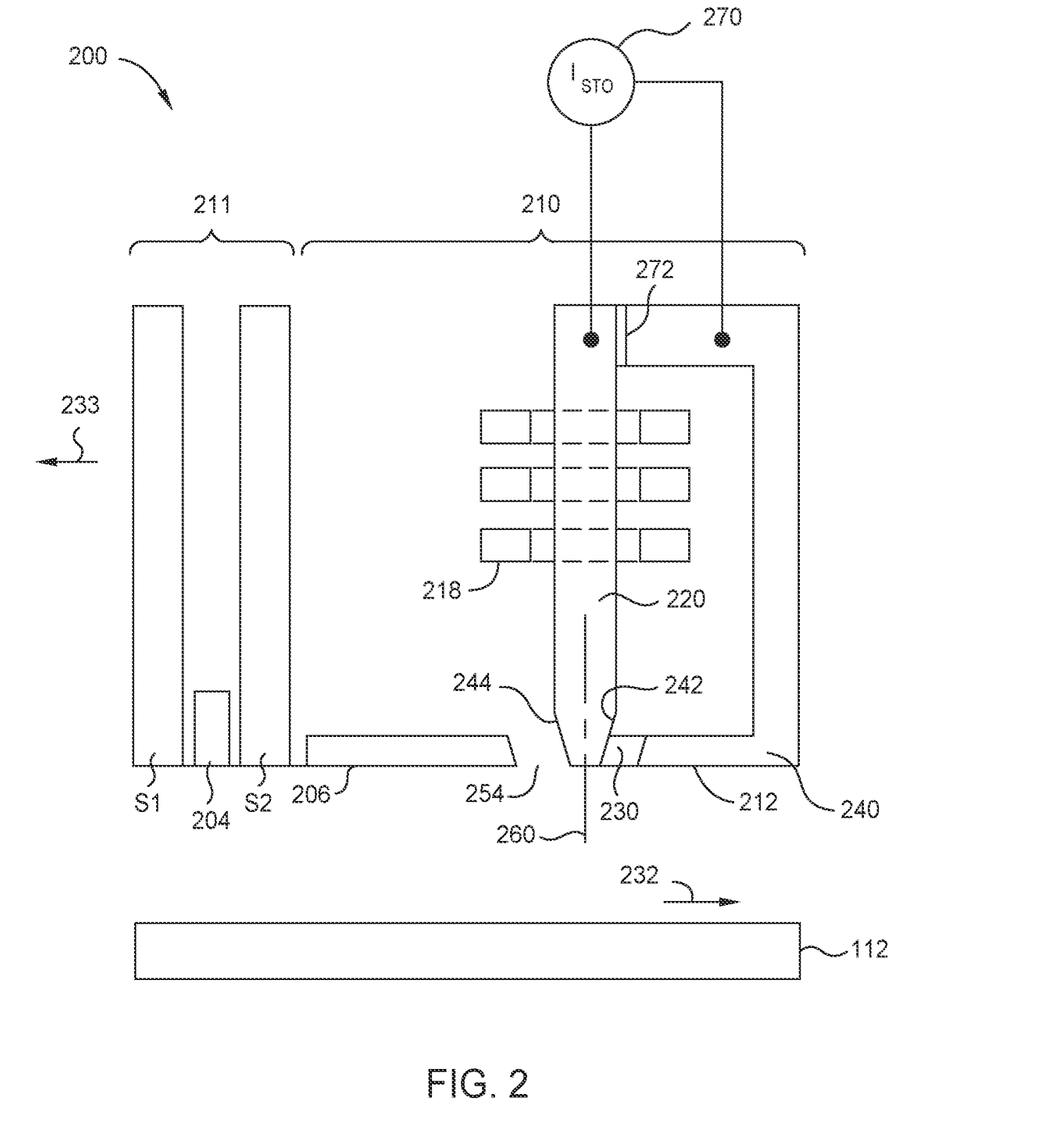
FIG. 2 is a fragmented, cross sectional side view through the center of a read/write head facing the magnetic media, according to one embodiment.

FIG. 2 is a schematic illustration of a cross sectional side view of a head assembly 200 facing the magnetic media 112 shown in FIG. 1 or other magnetic storage medium, according to one implementation. The head assembly 200 may correspond to the magnetic head assembly 121 described in FIG. 1. The head assembly 200 includes a media facing surface (MFS) 212, such as an air bearing surface (ABS), facing the magnetic media 112. As shown in FIG. 2, the magnetic media 112 (which may be a rotatable magnetic disk) relatively moves in the direction indicated by the arrow 232 and the head assembly 200 relatively moves in the direction indicated by the arrow 233.

In one embodiment, which can be combined with other embodiments, the head assembly 200 includes a magnetic read head 211. The magnetic read head 211 may include a sensing element 204 disposed between shields S1 and S2. The sensing element 204 is a magnetoresistive (MR) sensing element, such an element exerting a tunneling magnetoresistive (TMR) effect, a magnetoresistance (GMR) effect, an extraordinary magneto-Resistive (EMR) effect, or a spin torque oscillator (STO) effect. The magnetic fields of magnetized regions in the magnetic media 112, such as perpendicular recorded bits or longitudinal recorded bits, are detectable by the sensing element 204 as the recorded bits.

The head assembly 200 includes a write head 210. In one embodiment, which can be combined with other embodiments, the write head 210 includes a main pole 220, a leading shield 206, a trailing shield 240, and a spintronic device 230 disposed between the main pole 220 and the trailing shield 240. The main pole 220 serves as a first electrode. Each of the main pole 220, the spintronic device 230, the leading shield 206, and the trailing shield 240 has a front portion at the MFS.

The main pole 220 includes a magnetic material, such as CoFe, CoFeNi, or FeNi, other suitable magnetic materials. In one embodiment, which can be combined with other embodiments, the main pole 220 includes small grains of magnetic materials in a random texture, such as body-centered cubic (BCC) materials formed in a random texture. In one example, a random texture of the main pole 220 is formed by electrodeposition. The write head 210 includes a coil 218 around the main pole 220 that excites the main pole 220 to produce a writing magnetic field for affecting a magnetic recording medium of the magnetic media 112. The coil 218 may be a helical structure or one or more sets of pancake structures.

In one embodiment, which can be combined with other embodiments, the main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree or different degree of taper with respect to a longitudinal axis 260 of the main pole 220. In one embodiment, which can be combined with other embodiments, the main pole 220 does not include the trailing taper 242 and the leading taper 244. In such an embodiment, the main pole 220 includes a trailing side and a leading side in which the trailing side and the leading side are substantially parallel.

The trailing shield 240 includes a magnetic material, such as FeNi, or other suitable magnetic materials, serving as a second electrode and return pole for the main pole 220. The leading shield 206 may provide electromagnetic shielding and is separated from the main pole 220 by a leading gap 254.

In some embodiments, the spintronic device 230 is positioned proximate the main pole 220 and reduces the coercive force of the magnetic recording medium, so that smaller writing fields can be used to record data. In such embodiments, an electron current is applied to spintronic device 230 from a current source 270 to produce a microwave field. The electron current may include direct current (DC) waveforms, pulsed DC waveforms, and/or pulsed current waveforms going to positive and negative voltages, or other suitable waveforms. In other embodiments, an electron current is applied to spintronic device 230 from a current source 270 to produce a high frequency alternating current (AC) field to the media.

In one embodiment, which can be combined with other embodiments, the spintronic device 230 is electrically coupled to the main pole 220 and the trailing shield 240. The main pole 220 and the trailing shield 240 are separated in an area by an insulating layer 272. The current source 270 may provide electron current to the spintronic device 230 through the main pole 220 and the trailing shield 240. For direct current or pulsed current, the current source 270 may flow electron current from the main pole 220 through the spintronic device 230 to the trailing shield 240 or may flow electron current from the trailing shield 240 through the spintronic device 230 to the main pole 220 depending on the orientation of the spintronic device 230. In one embodiment, which can be combined with other embodiments, the spintronic device 230 is coupled to electrical leads providing an electron current other than from the main pole 220 and/or the trailing shield 240.

Various figures below reference MFS, which conventionally denotes a media facing surface view in the context of a recording head over a magnetic recording medium. Similar references to tracks are used to denote conventional directions and orientations of objects relative to recorded tracks in magnetic recording. However, as mentioned above, the embodiments of various spintronic devices disclosed are not so limited to this magnetic recording context, and as such, references to MFS and tracks are intended for illustration purposes only and not to limit the applications of the spintronic devices disclosed.

Example Spin-Torque Oscillators

Figure 3A:
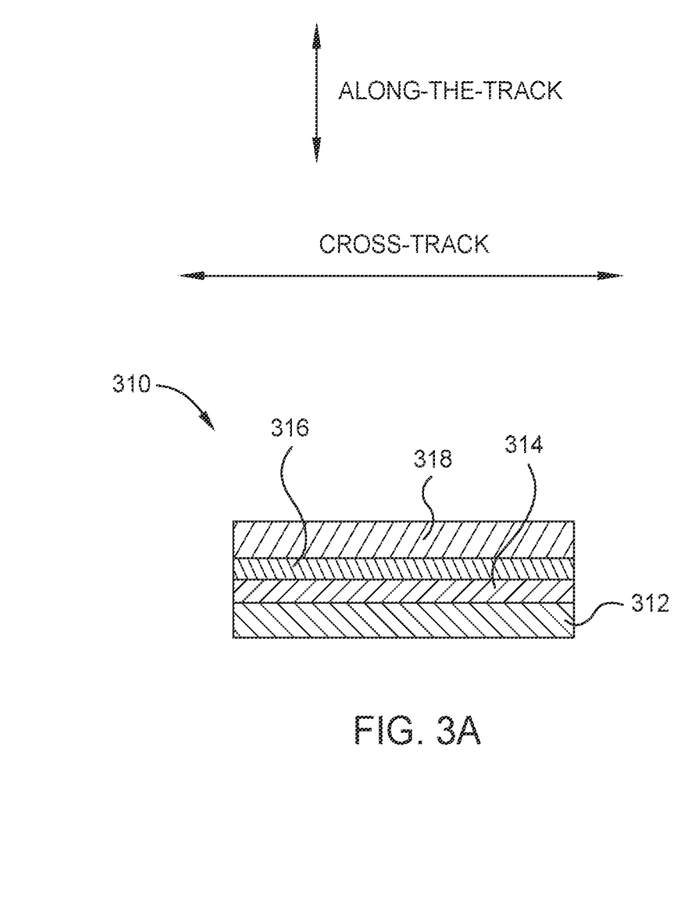
FIG. 3A is a schematic media facing surface (MFS) view of an example spin torque oscillator (STO) that can be used with embodiments described herein.
Figure 3B:
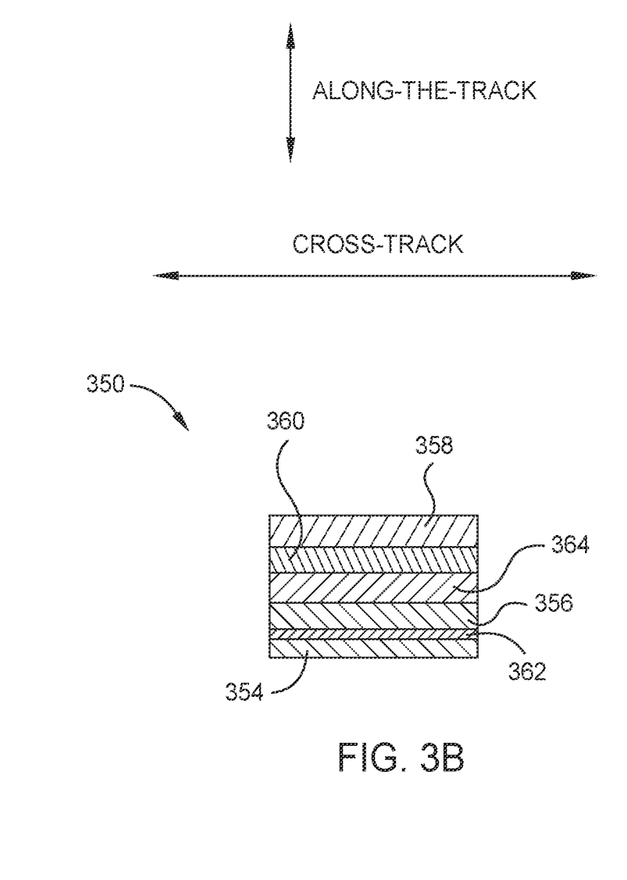
FIG. 3B is a schematic MFS view of an example STO that can be used with embodiments described herein.

Embodiments described herein can include a spin torque oscillator (STO), non-limiting examples of which are shown in FIGS. 3A and 3B. It is to be understood that any suitable generic spin torque oscillator, including modifications and/or alterations, can be utilized with embodiments described herein. Generally, the STO can have a top lead and a bottom lead. When used in magnetic recording (e.g., in the write head), the STO is typically positioned at a location between a main pole (or a bottom lead) and a trailing shield (or a top lead).

FIG. 3A is a MFS view of an example STO 310 that can be used with embodiments described herein. The STO 310 includes a seed layer 312, a layer 314 comprising a spin torque material or a ferromagnetic material, such as a spin torque layer (STL) 314, disposed on the seed layer 312, a spacer layer 316 disposed on the STL 314, and a notch layer 318 disposed on the spacer layer 316. The notch layer 318 provides torque to the STL 314. The STO 310 is a forward stack STO. Reverse stack STOs are also contemplated, meaning that the layers are in reverse order relative to the order shown in the figure. A width W of the STO 310 can be about 1 μm or less, such as less than about 500 nm, such as less than about 200 nm, such as from about 1 nm to about 200 nm, such as from about 5 nm to about 150 nm, such as from about 10 nm to about 100 nm, such as from about 20 nm to about 80 nm, such as from about 40 nm to about 60 nm. Larger or smaller widths of the STO 310 are contemplated.

The seed layer 312 can include any conductive material, e.g., a NiFeTa/Ru/NiAl multilayer structure. The STL 314 can include a ferromagnetic material, e.g., Ni, Fe, Co, alloys thereof (e.g., NiFe, CoFe), materials including such metals or alloys, or combinations thereof. The spacer layer 316 can include, e.g., Cu, Ni, Al, Ag, alloys thereof (e.g., NiAl), materials including such metals or alloys, or combinations thereof. The notch layer 318 can include, e.g., Co, Fe, alloys thereof, a Heusler alloy (e.g., Co—Mn—Ge with, e.g., high spin polarization), materials including such metals or alloys, or combinations thereof. The aforementioned materials for the layers of the STO 310 are not intended to be limiting as other suitable materials can be utilized.

FIG. 3B is a MFS view of an example STO 350 that can be used with embodiments described herein. The STO 350 includes a seed layer 354, a spin polarization layer (SPL) 362 disposed on the seed layer 354, a spacer layer 356 disposed on the SPL 362, a field generation layer (FGL) 364 disposed on the spacer layer 356, a second spacer layer 360 disposed on the FGL 364, and a notch layer 358 disposed on the second spacer layer 360. The STO 350 is a forward stack STO. Reverse stack STOs are also contemplated, meaning that the layers in reverse order relative to the order shown in the figure. A width W of the STO 350 can be about 1 μm or less, such as less than about 500 nm, such as less than about 200 nm, such as from about 1 nm to about 200 nm, such as from about 5 nm to about 150 nm, such as from about 10 nm to about 100 nm, such as from about 20 nm to about 80 nm, such as from about 40 nm to about 60 nm. Larger or smaller widths of the STO 350 are contemplated.

The seed layer 354 can include, e.g., a NiFeTa/Ru/NiAl multilayer structure. The SPL 362 can include, e.g., a CoMnGe layer. The spacer layer 356 can include, e.g., Cu, Ni, Al, Ag, alloys thereof (e.g., NiAl materials including such metals or alloys, and combinations thereof. The FGL 364 can include, e.g., Co, Fe, a CoFe alloy, or Co/Fe multilayers, materials including such metals, alloys, or layers, or combinations thereof. The second spacer layer 360 can include, e.g., a Cu, Ni, Al, Ag, alloys thereof (e.g., NiAl), materials including such metals or alloys, multilayer structure including such metals or alloys, or combinations thereof. The aforementioned materials for the layers of the STO 350 are not intended to be limiting as other suitable materials can be utilized.

In conventional magnetic recording heads and similar devices, a seed layer of the STO is disposed on or in contact with a surface of the main pole (or bottom lead), while a trailing shield (or top lead) is disposed on or in contact with a hot seed layer of the STO. As described herein, and in contrast to conventional recording heads and similar devices, a layer having a Seebeck coefficient can be disposed between the STO and the main pole (or bottom lead) and/or between the STO and the trailing shield (or top lead).

Illustrative, but non-limiting, examples of materials useful for the main pole (or bottom lead) of devices described herein include, e.g., a magnetic material such as CoFe, CoFeNi, FeNi, and/or other suitable magnetic materials. Illustrative, but non-limiting, examples of materials useful for the trailing shield (or top lead) of devices described herein include, e.g., a magnetic material such as CoFe, CoFeNi, FeNi, and/or other suitable magnetic materials. The main pole (or bottom lead) of the devices described herein can be, e.g., the main pole 220 of FIG. 2 and the trailing shield (or top lead) of the devices described herein can be the trailing shield 240 of FIG. 2.

Example Spintronic Devices

In typical spintronic devices used in magnetic recording such as in a write head of a hard disk drive, the same material is used for both the trailing shield (or top lead) and the main pole (or bottom lead). As such, no Peltier cooling is observed in these typical spintronic devices used in magnetic recording, and in other magnetic recording or non-magnetic recording applications (e.g., MRAM, magnetic sensors) where the top and bottom leads are of the same material. In contrast, embodiments described herein utilize layer(s) that create a Seebeck coefficient difference along at least a portion of the spintronic device. The layer(s) can be disposed above one surface of the STO and/or below an opposite surface of the STO. As electrons flow across the STO perpendicular to the plane when a current is applied to the spintronic device, the STO is cooled via the Peltier effect. That is, the spintronic device is self-cooled.

The spintronic devices described herein can be used as, e.g., the spintronic device 230 or the sensing element 204 shown in FIG. 2, which are only non-limiting illustrations. For example, the spintronic devices 400, 500, 600, 700, 800, 900, 1000, and 1100 (described below) may be a spin-orbit torque (SOT) device or a magnetic tunnel junction (MTJ) driven by spin-orbit torque, which may be used in a magnetic recording reader or other type of sensor or memory, for example. The spintronic devices described herein can be utilized with, or otherwise incorporated into, various devices that utilize spintronic devices. Such articles that include the spintronic devices are, e.g., a magnetic media drive, a magnetoresistive random access memory device (e.g., a MRAM memory cell), a sensor (e.g., a magnetic sensor), a magnetic recording write head, a microwave assisted magnetic recording (MAMR) device, a tunneling magnetoresistance (TMR) device, in a giant magnetoresistance (GMR) device, or in a current-perpendicular-to-plane (CPP) GMR device. Further, embodiments described herein are useful for any suitable current-perpendicular-to-plane type spintronic device.

In at least one embodiment, a spintronic device described herein is coupled or electrically coupled to any of the aforementioned articles, or to one or more components of any of the aforementioned articles.

In the embodiments described herein, layers or materials are referred to as having a "negative Seebeck coefficient" or a "positive Seebeck coefficient." Layers and materials having a negative Seebeck coefficient refers to both layers/materials having a negative Seebeck coefficient and to layers/materials having a Seebeck coefficient that is less than that of the layers/materials having the positive Seebeck coefficient. Layers and materials having a positive Seebeck coefficient refers to both layers/materials having a positive Seebeck coefficient and to layers/materials having a Seebeck coefficient that is more than that of the layers/materials having the negative Seebeck coefficient.

In some embodiments, a first layer disposed on or in contact with a first side of the STO has a negative Seebeck coefficient and a second layer disposed on or in contact with a second side of the STO has a positive Seebeck coefficient, the second side of the STO being opposite the first side of the STO. The first layer having a negative Seebeck coefficient can be made of, or include, a cobalt containing material (e.g., $Co_{100-x}Fe_x$, Co), a full-Heusler alloy, such as those alloys made of Co, Mn, Ge, Sn, Ti, and/or Al (e.g., $Co_{50}Mn_{25}Ge_{25}$, $Co_{50}Mn_{25}Sn_{25}$, $Co_{50}Ti_{25}Al_{25}$, $Co_{50}Ti_{25}Sn_{25}$), Ni, NiFe, NiCu, or combinations thereof, where x is a positive number, such as from about 1 to about 80. The second layer having a positive Seebeck coefficient can be made of, or include, a chromium containing material (e.g., Cr, NiCr (e.g., $Ni_{100-x}Cr_x$) FeCr, or combinations thereof), where x is a positive number, such as from about 40 to about 100. It should be understood that these materials are only non-limiting illustrations of suitable materials useful for embodiments described herein, as other materials can be used to create a difference in Seebeck coefficient between layer(s) on opposite sides of the STO. For example, both the first layer and the second layer can have Seebeck coefficients greater than zero. As another example, both the first layer and the second layer can have Seebeck coefficients that are less than zero.

As an example, and in order for Peltier cooling to occur, the layers can be positioned about the STO such that electrons flow from the layer having the positive Seebeck coefficient (e.g., the second layer) to the layer having the negative Seebeck coefficient (e.g., the first layer). The observed Peltier cooling can improve, e.g., the bias offset and the breakdown current. As an example, for forward stack STOs, a positive bias offset was observed by utilizing layer(s) to create a difference in Seebeck coefficient across the STO.

In some embodiments, a difference in Seebeck coefficient (in units of $\mu$V/K) between the first layer and the second, which are positioned on opposite or substantially opposite sides of the STO (in units of $\mu$V/K) is about 1 or more and/or about 1,000 or less, such as from about 1 to about 100, such as from about 5 to about 95, such as from about 10 to about 90, such as from about 15 to about 85, such as from about 20 to about 80, such as from about 25 to about 75, such as from about 30 to about 70, such as from about 35 to about 65, such as from about 40 to about 60, such as from about 45 to about 55. Alternatively, the difference in Seebeck coefficient between the first layer and the second layer can be from about 5 to about 35, such as from about 10 to about 30, such as from about 15 to about 25.

The Seebeck coefficient of the material or layer is determined using the following example procedure. Here, a sample is set in a vertical position between the upper and lower blocks in the heating furnace of the system. While the sample is heated, and held, at a specified temperature, the sample is heated by the heater in the lower block to provide a temperature gradient. Seebeck coefficient is measured by measuring the upper and lower temperatures T1 and T2 with the thermocouples pressed against the side of the sample, followed by measurement of voltage.

Figure 4:
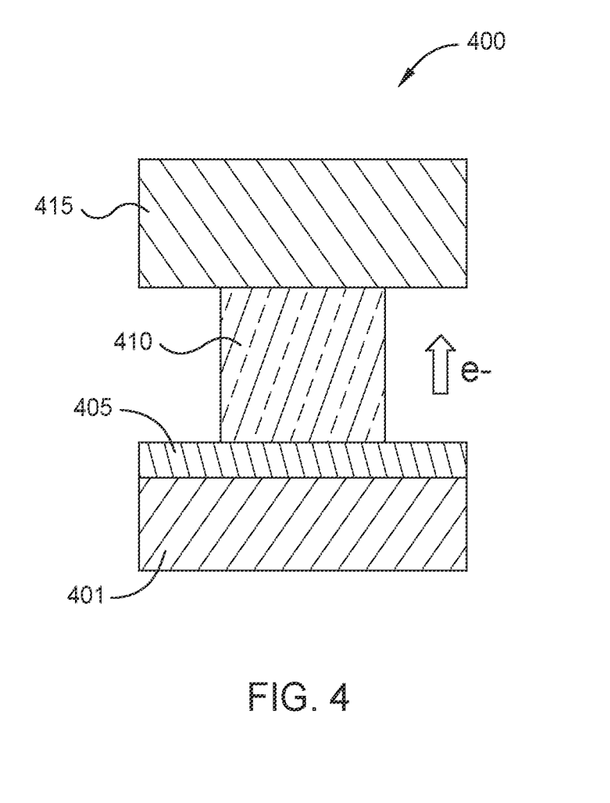
FIG. 4 is a schematic MFS view of an example spintronic device according to at least one embodiment.

FIG. 4 is a schematic MFS view of a spintronic device 400 according to at least one embodiment. The spintronic device 400 includes a forward stack STO, with electron flow indicated by the arrow. The spintronic device 400 includes a layer 405 disposed on or in contact with a bottom lead 401, an STO 410 (e.g., STO 310 or 350) disposed on or in contact with the layer 405, and a top lead 415 disposed on or in contact with the STO 410. The layer 405 can have a thickness from about 1 nm to about 20 nm, such as from about 2 nm to about 10 nm. In other embodiments, instead of the STO 410, the spintronic device 400 can instead include a SOT device, a MTJ device, or a CPP-GMR device, etc.

The materials used for the layer 405 and the top lead 415 can be chosen such that there is a difference in Seebeck coefficient between them. For example, the top lead 415 includes a material that has a negative Seebeck coefficient, such as a cobalt containing material such as CoFe and/or a nickel containing layer such as Ni, NiFe, NiCu, or combinations thereof; and the layer 405 includes a material having a positive Seebeck coefficient, such as a chromium containing material, such as Cr or NiCr.

In some embodiments, a second layer can be disposed above the STO 410 and below the top lead 415. This second layer can be made of, or include, a material having a negative Seebeck coefficient such as a cobalt containing material such as CoFe and/or a nickel containing layer such as Ni, NiFe, NiCu, or combinations thereof. When the spintronic device includes this second layer disposed above the STO 410 and below the top lead 415, the second layer can be made of a material that is different than the top lead 415.

In some embodiments, the top lead 415 includes multiple layers. In these and other embodiments, the layer in the top lead 415 that is adjacent to the STO 410 can be made of, or include a material having a negative Seebeck coefficient such as those described herein. The remaining layer(s) of the top lead 415 can be made of a conductive material such as Cu, Au, Pt, Ir, or combinations thereof.

In some embodiments, a refill material, e.g., an insulating material, can be disposed on either side of the STO 410, and in contact with one or more of the layer 405, the STO 410, or the top lead 415. The refill material can serve to dissipate heat from the STO 410, and can be made of AlO, TaO, and/or AlN.

Figure 5:
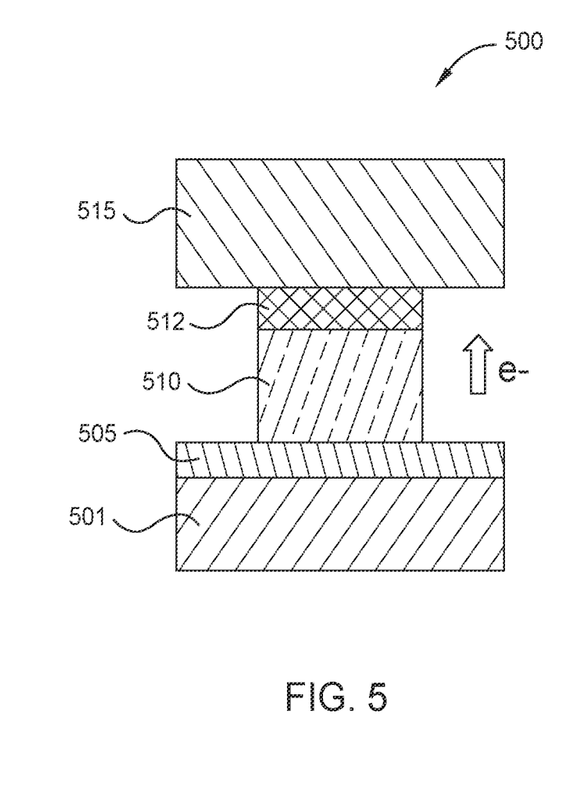
FIG. 5 is a schematic MFS view of an example spintronic device according to at least one embodiment.

FIG. 5 is a schematic MFS view of a spintronic device 500 according to at least one embodiment. The spintronic device 500 includes a forward stack STO, with electron flow indicated by the arrow. The spintronic device 500 includes a layer 505 disposed on or in contact with a bottom lead 501, an STO 510 (e.g., STO 310 or 350) disposed on or in contact with the layer 505, a notch layer 512 (e.g., same as the notch layer 318 in FIG. 3A or the notch layer 358 in FIG. 3B) disposed on or in contact with the STO 510, and a top lead 515 disposed on or in contact with the notch layer 512. The layer 505 can have a thickness from about 1 nm to about 20 nm, such as from about 2 nm to about 10 nm. The notch layer 512 can have a thickness from about 1 nm to about 20 nm, such as from about 2 nm to about 10 nm. The notch layer 512 can be made of a cobalt containing material, such as CoFe. In other embodiments, instead of the STO 510, the spintronic device 500 can instead include a SOT device, a MTJ device, or a CPP-GMR device, etc.

The materials used for the layer 505 and the top lead 515 can be chosen such that there is a difference in Seebeck coefficient between them. For example, the top lead 515 includes a material that has a negative Seebeck coefficient, such as a cobalt containing material such as CoFe and/or a nickel containing layer such as Ni, NiFe, NiCu, or combinations thereof; and the layer 505 includes a material having a positive Seebeck coefficient, such as a chromium containing material, such as Cr or NiCr.

In at least one embodiment, the notch layer 512 can be made of, or include, a material having a negative Seebeck coefficient, such as a cobalt containing material, such as CoFe, and/or a nickel containing layer such as Ni, NiFe, NiCu, or combinations thereof. In some embodiments, a second layer can be disposed above the notch layer 512 and below the top lead 515. This second layer can be made of, or include, a material having a negative Seebeck coefficient such as a cobalt containing material, such as CoFe, and/or a nickel containing layer such as Ni, NiFe, NiCu, or combinations thereof. When the spintronic device includes this second layer disposed above the notch layer 512 and below the top lead 515, the second layer can be made of a material that is different than the top lead 515.

In some embodiments, a refill material, e.g., an insulating material, can be disposed on either side of the STO 510, and in contact with one or more of the layer 505, the STO 510, the notch layer 512, or the top lead 515. The refill material can serve to dissipate heat from the STO 510, and can be made of AlO, TaO, and/or AlN.

Figure 6:
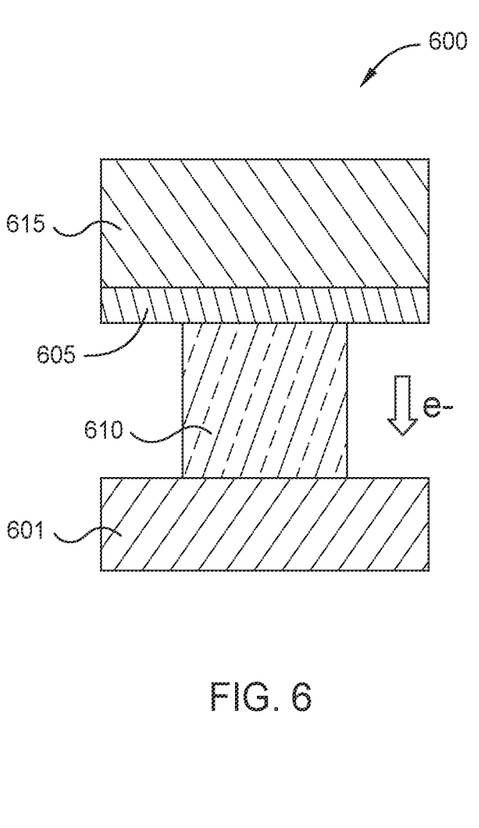
FIG. 6 is a schematic MFS view of an example spintronic device according to at least one embodiment.

FIG. 6 is a schematic MFS view of a spintronic device 600 according to at least one embodiment. The spintronic device 600 includes a reverse stack STO, with electron flow indicated by the arrow. The spintronic device 600 includes an STO 610 (e.g., STO 310 or 350) disposed on or in contact with the bottom lead 601, a layer 605 disposed on or in contact with the STO 610, and a top lead 615 disposed on or in contact with the layer 605. The layer 605 can have a thickness from about 1 nm to about 20 nm, such as from about 2 nm to about 10 nm. In other embodiments, instead of the STO 610, the spintronic device 600 can instead include a SOT device, a MTJ device, a CPP-GMR device, etc.

The materials used for the layer 605 and the bottom lead 601 can be chosen such that there is a difference in Seebeck coefficient between them. For example, the bottom lead 601 includes a material that has a negative Seebeck coefficient, such as a cobalt containing material, such as CoFe, and/or a nickel containing layer such as Ni, NiFe, NiCu, or combinations thereof; and the layer 605 includes a material having a positive Seebeck coefficient, such as a chromium containing material, such as Cr or NiCr. In some embodiments, a second layer can be disposed above the bottom lead 601 and below the STO 610. This second layer can be made of, or include, a material having a negative Seebeck coefficient, such as a cobalt containing material, such as CoFe, and/or a nickel containing layer such as Ni, NiFe, NiCu, or combinations thereof. When the spintronic device includes this second layer disposed above the bottom lead 601 and below the STO 610, the second layer can be made of a material that is different than the bottom lead 601.

In some embodiments, a refill material, e.g., an insulating material, can be disposed on either side of the STO 610, and in contact with one or more of the bottom lead 601, the layer 605, or the STO 610. The refill material can serve to dissipate heat from the STO 610, and can be made of AlO, TaO, and/or AlN.

Figure 7:
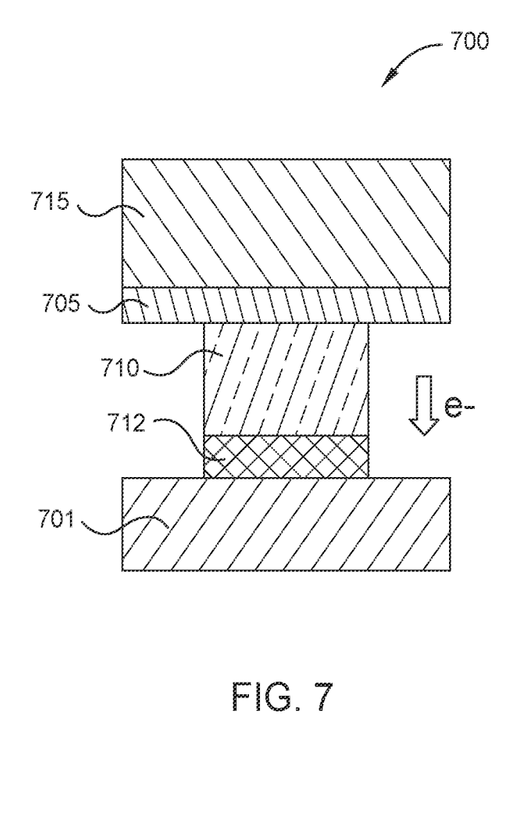
FIG. 7 is a schematic MFS view of an example spintronic device according to at least one embodiment.

FIG. 7 is a schematic MFS view of a spintronic device 700 according to at least one embodiment. The spintronic device 700 includes a reverse stack STO. The spintronic device 700 includes a main pole (MP) notch layer 712 disposed on or in contact with the bottom lead 701, an STO 710 disposed on or in contact with the MP notch layer 712, a layer 705 disposed on or in contact with the STO 710, and a top lead 715 disposed on or in contact with the layer 705. The layer 705 can have a thickness from about 1 nm to about 20 nm, such as from about 2 nm to about 10 nm. The MP notch layer 712 can have a thickness from about 0.1 nm to about 10 nm, such as from about 1 nm to about 5 nm. The MP notch layer 712 can include a cobalt containing material, such as CoFe. In other embodiments, instead of the STO 710, the spintronic device 700 can instead include a SOT device, a MTJ device, a CPP-GMR device, etc.

The materials used for the layer 705 and the bottom lead 701 can be chosen such that there is a difference in Seebeck coefficient between them. For example, the layer 705 includes a material having a positive Seebeck coefficient, such as a chromium containing material, such as Cr or NiCr, and the bottom lead 701 includes a material that has a negative Seebeck coefficient, such as a cobalt containing material, such as Co, CoFe, $Co_{50}Mn_{25}Ge_{25}$, or multilayer structures of such metals or alloys, or combinations thereof.

In some embodiments, the MP notch layer 712 can include a material that has a negative Seebeck coefficient, such as a cobalt containing material, such as CoFe. Additionally, or alternatively, a second layer can be disposed above the bottom lead 701 and below the MP notch layer 712. This second layer can be made of, or include, a material having a negative Seebeck coefficient such as a cobalt containing material, such as CoFe. When the spintronic device includes this second layer disposed above the bottom lead 701 and below the MP notch layer 712, the second layer can be made of a material that is different than the bottom lead 701.

Other materials having a negative Seebeck coefficient and other materials having a positive Seebeck coefficient are described above.

In some embodiments, a refill material, e.g., an insulating material, can be disposed on either side of the STO 710, and in contact with one or more of the bottom lead 701, the layer 705, the STO 710, or the MP notch layer 712. The refill material can serve to dissipate heat from the STO 710, and can be made of AlO, TaO, and/or AlN.

Figure 8:
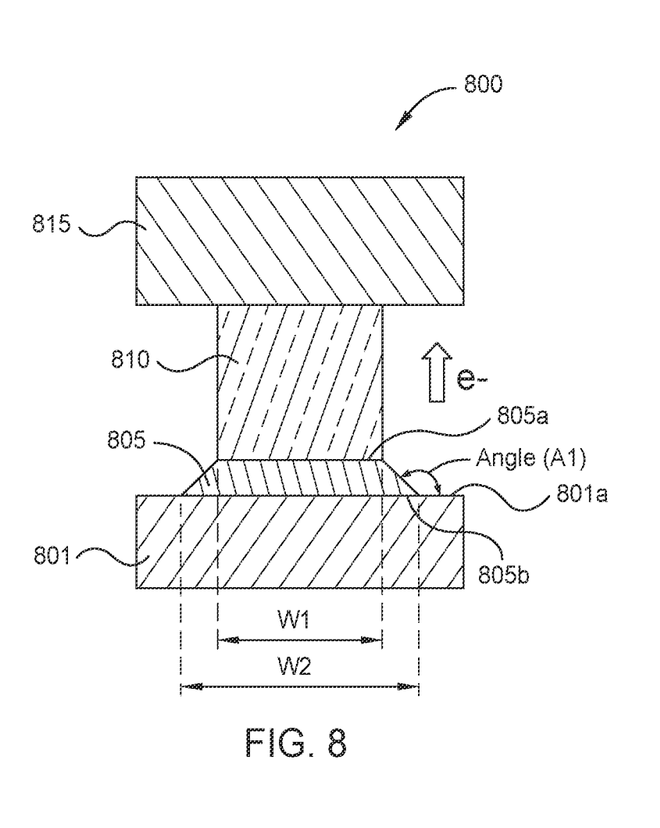
FIG. 8 is a schematic MFS view of an example spintronic device according to at least one embodiment.

FIG. 8 is a schematic MFS view of a spintronic device 800 according to at least one embodiment. The spintronic device 800 includes a forward stack STO, with electron flow indicated by the arrow. The spintronic device 800 includes a layer 805 disposed on or in contact with the bottom lead 801, an STO 810 (e.g., STO 310 or 350) disposed on or in contact with the layer 805, and a top lead 815 disposed on or in contact with the STO 810. The layer 805 can have a thickness from about 1 nm to about 20 nm, such as from about 2 nm to about 10 nm. In other embodiments, instead of the STO 810, the spintronic device 800 can instead include a SOT device, a MTJ device, a CPP-GMR device, etc.

The materials used for the layer 805 and the top lead 815 can be chosen such that there is a difference in Seebeck coefficient between them. For example, the top lead 815 includes a material that has a negative Seebeck coefficient, such as a cobalt containing material, such as such as Co, CoFe, $Co_{50}Mn_{25}Ge_{25}$, or multilayer structures of such metals or alloys, or combinations thereof, and the layer 805 includes a material having a positive Seebeck coefficient, such as a chromium containing material, such as Cr or NiCr. Other materials having a negative Seebeck coefficient and other materials having a positive Seebeck coefficient are described above.

In some embodiments, a refill material, e.g., an insulating material, can be disposed on either side of the STO 810, and in contact with one or more of the bottom lead 801, the layer 805, the STO 810, or the top lead 815. The refill material can serve to dissipate heat from the STO 810, and can be made of AlO, TaO, and/or AlN.

In the embodiment shown in FIG. 8, the layer 805 having a positive Seebeck coefficient can be tapered such that a first surface 805a of the layer 805 has a width W1 that is shorter than a width W2 of a second surface 805b of the layer 805. That is, W1<W2. W1 can be about 10 nm to about 80 nm, such as from about 20 nm to about 50 nm; and/or W2 can be about 10 nm to about 80 nm, such as from about 20 nm to about 50 nm so long as W1<W2.

The first surface 805a of the layer 805 can be in contact with the STO 810 and the second surface 805b of the layer 805 can be in contact with the bottom lead 801. The taper of the layer 805 can be defined by a taper angle, A1, which corresponds to the angle between the side wall of the layer 805 and a first surface 801a of the bottom lead 801. In at least one embodiment, the taper angle, A1, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A1 is from about 120° to about 160°, such as from about 125° to about 155°, such as from about 130° to about 150°, such as from about 135° to about 145°.

Figure 9:
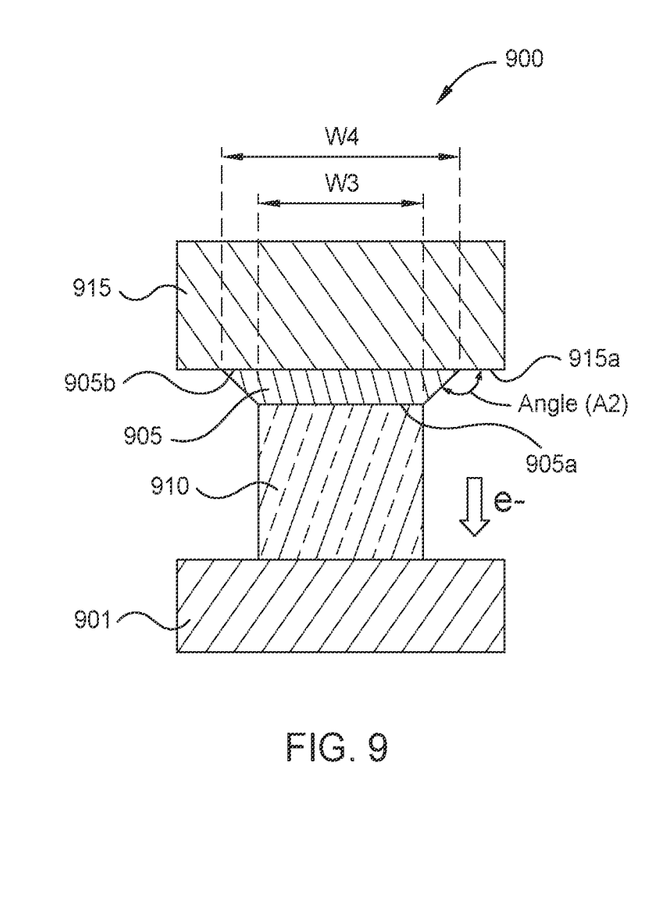
FIG. 9 is a schematic MFS view of an example spintronic device according to at least one embodiment.

FIG. 9 is a schematic MFS view of a spintronic device 900 according to at least one embodiment. The spintronic device 900 includes a reverse stack STO, with electron flow indicated by the arrow. The spintronic device 900 includes a STO 910 (e.g., STO 310 or 350) disposed on or in contact with the bottom lead 901, a layer 905 disposed on or in contact with the STO 910, and a top lead 915 disposed on or in contact with the layer 905. The layer 905 can have a thickness from about 1 nm to about 20 nm, such as from about 2 nm to about 10 nm. In other embodiments, instead of the STO 910, the spintronic device 900 can instead include a SOT device, a MTJ device, a CPP-GMR device, etc.

The materials used for the layer 905 and the bottom lead 901 can be chosen such that there is a difference in Seebeck coefficient between them. For example, the bottom lead 901 includes a material that has a negative Seebeck coefficient, such as a cobalt containing material, such as such as Co, CoFe, $Co_{50}Mn_{25}Ge_{25}$, or multilayer structures of such metals or alloys, or combinations thereof, and the layer 905 includes a material having a positive Seebeck coefficient, such as a chromium containing material, such as Cr or NiCr. Other materials having a negative Seebeck coefficient and other materials having a positive Seebeck coefficient are described above.

In some embodiments, a refill material, e.g., an insulating material, can be disposed on either side of the STO 910, and in contact with one or more of the bottom lead 901, the layer 905, the STO 910, or the top lead 915. The refill material can serve to dissipate heat from the STO 910, and can be made of AlO, TaO, and/or AlN.

In the embodiment shown in FIG. 9, the layer 905 having a positive Seebeck coefficient can be tapered such that a first surface 905a of the layer 905 has a width W3 that is shorter than a width W4 of a second surface 905b of the layer 905. That is, W3<W4. W3 can be about 10 nm to about 80 nm, such as from about 20 nm to about 50 nm; and/or W4 can be about 10 nm to about 80 nm, such as from about 20 nm to about 50 nm so long as W3<W4.

The first surface 905a of the layer 905 can be in contact with the STO 910 and the second surface 905b of the layer 905 can be in contact with the top lead 915. The taper of the layer 905 can be defined by a taper angle, A2, which corresponds to the angle between the side wall of the layer 905 and a first surface 915b of the top lead 915. In at least one embodiment, the taper angle, A2, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A2 is from about 120° to about 160°, such as from about 125° to about 155°, such as from about 130° to about 150°, such as from about 135° to about 145°.

Figure 10:
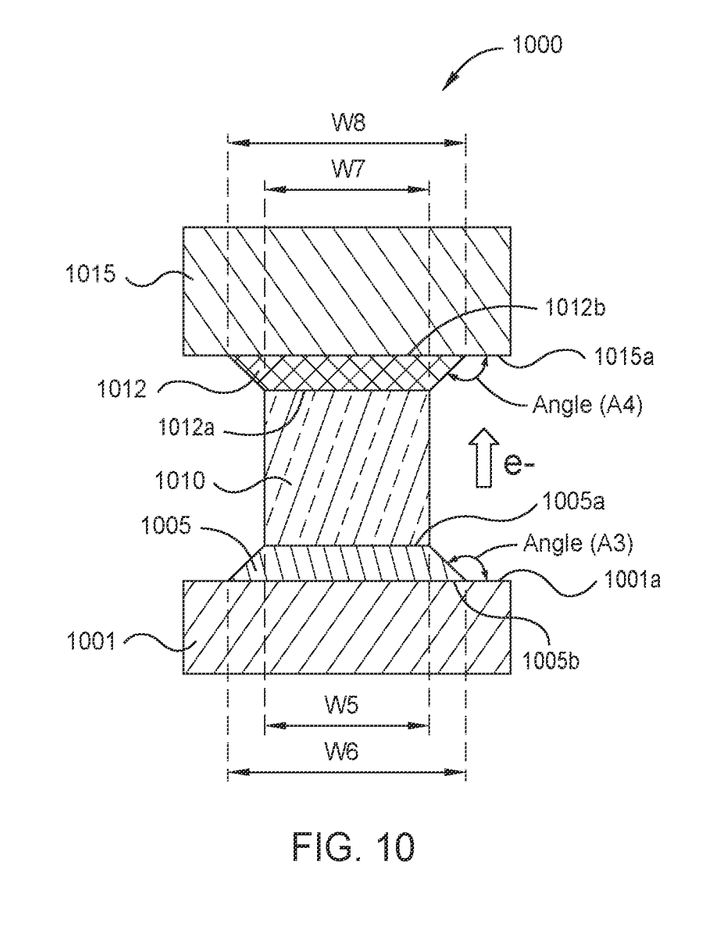
FIG. 10 is a schematic MFS view of an example spintronic device according to at least one embodiment.

FIG. 10 is a schematic MFS view of a spintronic device 1000 according to at least one embodiment. The spintronic device 1000 includes a forward stack STO, with electron flow indicated by the arrow. The spintronic device 1000 includes a first layer 1005 disposed on or in contact with a bottom lead 1001, a STO 1010 (e.g., STO 310 or 350) disposed on or in contact with the first layer 1005, a second layer 1012 disposed on or in contact with the STO 1010, and a top lead 1015 disposed on or in contact with the second layer 1012. The first layer 1005 can have a thickness from about 1 nm to about 20 nm, such as from about 2 nm to about 10 nm. The second layer 1012 can have a thickness from about 0.1 nm to about 10 nm, such as from about 1 nm to about 5 nm. In other embodiments, instead of the STO 1010, the spintronic device 1000 can instead include a SOT device, a MTJ device, or a CPP-GMR device, etc.

The materials used for the first layer 1005 and the second layer 1012 can be chosen such that there is a difference in Seebeck coefficient between them. For example, the first layer 1005 includes a material that has a positive Seebeck coefficient, such as a chromium containing material, such as Cr or NiCr, and the second layer 1012 includes a material having a negative Seebeck coefficient, such as a cobalt containing material, such as Co, CoFe, $Co_{50}Mn_{25}Ge_{25}$, or multilayer structures of such metals or alloys, or combinations thereof. Other materials having a negative Seebeck coefficient and other materials having a positive Seebeck coefficient are described above.

In some embodiments, a refill material, e.g., an insulating material, can be disposed on either side of the STO 1010, and in contact with one or more of the bottom lead 1001, the first layer 1005, the STO 1010, the second layer 1012, or the top lead 1015. The refill material can serve to dissipate heat from the STO 1010, and can be made of AlO, TaO, and/or AlN.

In the embodiment shown in FIG. 10, the first layer 1005 having a positive Seebeck coefficient can be tapered such that a first surface 1005a of the first layer 1005 has a width W5 that is shorter than a width W6 of a second surface 1005b of the first layer 1005. That is, W5<W6. W5 can be about 10 nm to about 80 nm, such as from about 20 nm to about 50 nm; and/or W6 can be about 10 nm to about 80 nm, such as from about 20 nm to about 50 nm so long as W5<W6.

The first surface 1005a of the first layer 1005 can be in contact with the STO 1010 and the second surface 1005b of the first layer 1005 can be in contact with the bottom lead 1001. The taper of the first layer 1005 can be defined by a taper angle, A3, which corresponds to the angle between the side wall of the first layer 1005 and a first surface 1001a of the bottom lead 1001. In at least one embodiment, the taper angle, A3, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A3 is from about 120° to about 160°, such as from about 125° to about 155°, such as from about 130° to about 150°, such as from about 135° to about 145°.

The second layer 1012 having a negative Seebeck coefficient can be tapered such that a first surface 1012a of the second layer 1012 has a width W7 that is shorter than a width W8 of a second surface 1012b of the second layer 1012. That is, W7<W8. W7 can be about 10 nm to about 80 nm, such as from about 20 nm to about 50 nm; and/or W8 can be about 10 nm to about 80 nm, such as from about 20 nm to about 50 nm so long as W7<W8.

The first surface 1012a of the second layer 1012 can be in contact with the STO 1010 and the second surface 1012b of the second layer 1012 can be in contact with the top lead 1015. The taper of the second layer 1012 can be defined by a taper angle, A4, which corresponds to the angle between the side wall of the second layer 1012 and a surface 1015a of the top lead 1015. In at least one embodiment, the taper angle, A4, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A4 is from about 120° to about 160°, such as from about 125° to about 155°, such as from about 130° to about 150°, such as from about 135° to about 145°.

Figure 11:
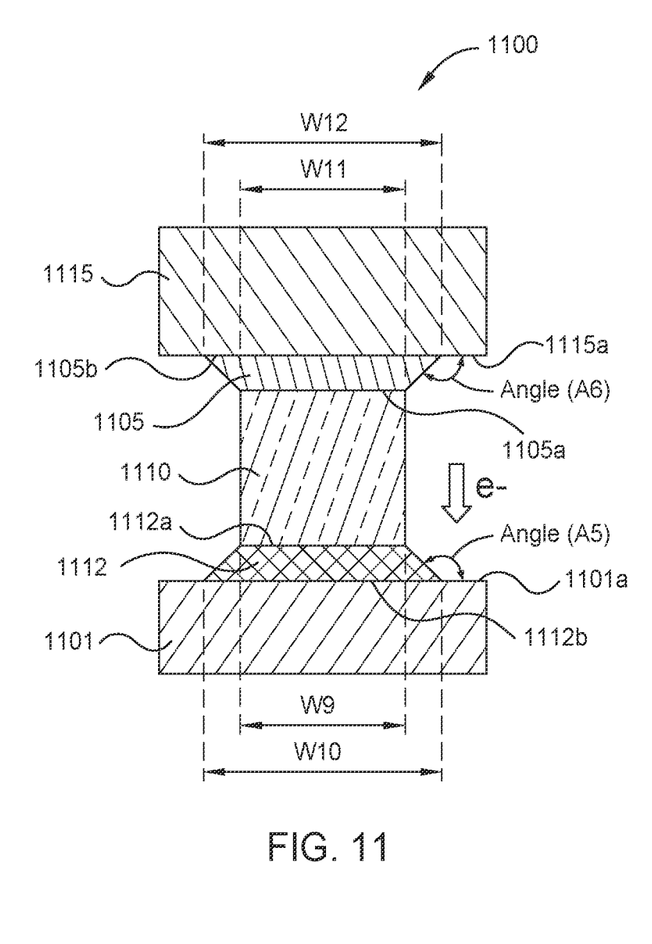
FIG. 11 is schematic MFS view of an example spintronic device according to at least one embodiment.

FIG. 11 is schematic MFS view of a spintronic device 1100 according to at least one embodiment. The spintronic device 1100 includes a reverse stack STO, with electron flow indicated by the arrow. The spintronic device 1100 includes a first layer 1112 disposed on or in contact with a bottom lead 1101, a STO 1110 (e.g., STO 310 or 350) disposed on or in contact with the first layer 1112, a second layer 1105 disposed on or in contact with the STO 1110, and a top lead 1115 disposed on or in contact with the second layer 1105. The second layer 1105 can have a thickness from about 1 nm to about 20 nm, such as from about 2 nm to about 10 nm. The first layer 1112 can have a thickness from about 0.1 nm to about 10 nm, such as from about 1 nm to about 5 nm. In other embodiments, instead of the STO 1110, the spintronic device 1100 can instead include a SOT device, a MTJ device, or a CPP-GMR device, etc.

The materials used for the first layer 1112 and the second layer 1105 can be chosen such that there is a difference in Seebeck coefficient between them. For example, the first layer 1112 includes a material that has a negative Seebeck coefficient, such as a cobalt containing material, such as Co, CoFe, $Co_{50}Mn_{25}Ge_{25}$, or multilayer structures of such metals or alloys, or combinations thereof, and the second layer 1105 includes a material that has a positive Seebeck coefficient, such as a chromium containing material, such as Cr or NiCr. Other materials having a negative Seebeck coefficient and other materials having a positive Seebeck coefficient are described above.

In some embodiments, a refill material, e.g., an insulating material, can be disposed on either side of the STO 1110, and in contact with one or more of the bottom lead 1101, the second layer 1105, the STO 1110, the first layer 1112, or the top lead 1115. The refill material can serve to dissipate heat from the STO 1110, and can be made of AlO, TaO, and/or AlN.

In the embodiment shown in FIG. 11, the first layer 1112 having a negative Seebeck coefficient can be tapered such that a first surface 1112a of the first layer 1112 has a width W9 that is shorter than a width W10 of a second surface 1112b of the first layer 1112. That is, W9<W10. W9 can be about 10 nm to about 80 nm, such as from about 20 nm to about 50 nm; and/or W10 can be about 10 nm to about 80 nm, such as from about 20 nm to about 50 nm so long as W9<W10.

The first surface 1112a of the first layer 1112 can be in contact with the STO 1110 and the second surface 1112b of the first layer 1112 can be in contact with the bottom lead 1101. The taper of the first layer 1112 can be defined by a taper angle, A5, which corresponds to the angle between the side wall of the first layer 1112 and a surface 1101a of the bottom lead 1101. In at least one embodiment, the taper angle, A5, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A5 is from about 120° to about 160°, such as from about 125° to about 155°, such as from about 130° to about 150°, such as from about 135° to about 145°.

The second layer 1105 having a positive Seebeck coefficient can be tapered such that a first surface 1105a of the second layer 1105 has a width W11 that is shorter than a width W12 of a second surface 1105b of the second layer 1105. That is, W11<W12. W11 can be about 10 nm to about 80 nm, such as from about 20 nm to about 50 nm; and/or W12 can be about 10 nm to about 80 nm, such as from about 20 nm to about 50 nm so long as W11<W12.

The first surface 1105a of the second layer 1105 can be in contact with the STO 1110 and the second surface 1105b of the second layer 1105 can be in contact with the top lead 1115. The taper of the second layer 1105 can be defined by a taper angle, A6, which corresponds to the angle between the side wall of the second layer 1105 and a surface 1115a of the top lead 1115. In at least one embodiment, the taper angle, A6, is about 90° or more and about 180° or less, such as from about 95° to about 175°, such as from about 100° to about 170°, such as from about 105° to about 165°, such as from about 110° to about 160°, such as from about 115° to about 155°, such as from about 120° to about 150°, such as from about 125° to about 145°, such as from about 130° to about 140°, such as from about 115° to about 155°. In some embodiments, A6 is from about 120° to about 160°, such as from about 125° to about 155°, such as from about 130° to about 150°, such as from about 135° to about 145°.

Embodiments described herein generally relate to self-cooling spintronic devices. The self-cooling spintronic devices can be incorporated or utilized with various articles.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the aforementioned embodiments, aspects, features, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
   a spintronic device having a first side and a second side opposite the first side;
   a first layer disposed on the first side; and
   a second layer disposed on the second side, the first layer having a Seebeck coefficient that is different from a Seebeck coefficient of the second layer,
   wherein the first layer is tapered such that a first surface of the first layer has a width that is shorter than a second width of a second surface of the first layer, the second surface opposite the first surface, and the first surface adjacent to the spintronic device, and
   wherein the spintronic device is sandwiched between a bottom lead and a top lead.

2. The device of claim 1, wherein the spintronic device is a spintronic oscillator (STO), a spin-orbit torque (SOT) device, a magnetic tunnel junction (MTJ), or a current-perpendicular-to-plane giant magnetoresistance (CPP-GMR) device.

3. The device of claim 1, wherein the first layer and the second layer are positioned about the spintronic device such that electrons flow from the layer having a higher Seebeck coefficient to the layer having a lower Seebeck coefficient when a current is applied to the spintronic device.

4. The device of claim 1, wherein a difference in Seebeck coefficient between the first layer and the second layer is about 5 µV/K or more.

5. The device of claim 4, wherein the difference in Seebeck coefficient between the first layer and the second layer is about 15 µV/K or more.

6. The device of claim 1, wherein:
   the first layer comprises a cobalt containing material; and
   the second layer comprises a chromium containing material.

7. The device of claim 1, wherein:
   the first layer comprises Co, CoFe, CoMnGe, CoMnSn, CoTiAl, CoTiSn, Ni, NiFe, NiCu, or combinations thereof; and
   the second layer comprises Cr, NiCr, FeCr, or combinations thereof.

8. The device of claim 1, wherein:
   the Seebeck coefficient of the first layer and the second layer are both greater than zero; or
   the Seebeck coefficient of the first layer and the second layer are both less than zero.

9. The device of claim 1, wherein the second layer is tapered.

10. The device of claim 1, wherein the second layer is tapered such that a first surface of the second layer has a width that is shorter than a second width of a second surface of the second layer, the second surface opposite the first surface, and the first surface adjacent to the spintronic device.

11. The device of claim 1, wherein an article is electrically coupled to the spintronic device, the article being a component of a magnetic media drive, a magnetoresistive random access memory device, a magnetic sensor, a magnetic recording write head, or a microwave assisted magnetic recording device.

12. A magnetic recording device comprising a write head, the write head comprising the device of claim 1.

13. A magnetic recording device comprising a read head, the read head comprising the device of claim 1.

14. A magneto-resistive random access memory (MRAM) comprising the device of claim 1.

15. A device, comprising:
    a bottom lead;
    a spintronic device disposed over the bottom lead, the spintronic device comprising a spintronic oscillator (STO), a spin-orbit torque (SOT) device, a magnetic tunnel junction (MTJ), or a current-perpendicular-to-plane giant magnetoresistance (CPP-GMR) device;
    a top lead disposed over the spintronic device; and
    a first layer, the first layer disposed between the bottom lead and the spintronic device or disposed between the top lead and the spintronic device, wherein the device is configured to self-cool when a current is applied to the device, wherein the first layer is tapered such that a first surface of the first layer has a width that is shorter than a second width of a second surface of the first layer, the second surface opposite the first surface, and the first surface adjacent to the spintronic device.

16. The device of claim 15, wherein, when the first layer is disposed between the bottom lead and the spintronic device, the first layer has a Seebeck coefficient that is greater than a Seebeck coefficient of the top lead.

17. The device of claim 16, further comprising a second layer disposed between the top lead and the spintronic device, the second layer having a Seebeck coefficient that is less than the Seebeck coefficient of the first layer.

18. The device of claim 17, wherein:
    the second layer has a first surface and a second surface opposite the first surface of the second layer, a width of the first surface of the second layer being shorter than a width of the second surface of the second layer, the first surface of the second layer in contact with the spintronic device.

19. The device of claim 15, wherein, when the first layer is disposed between the top lead and the spintronic device, the first layer has a Seebeck coefficient that is greater than the bottom lead.

20. The device of claim 19, further comprising a second layer disposed between the bottom lead and the spintronic device, the second layer having a Seebeck coefficient that is less than the Seebeck coefficient of the first layer.

21. A magnetic recording device comprising a write head, the write head comprising the device of claim 15.

22. A magnetic recording device comprising a read head, the read head comprising the device of claim 15.

23. A magneto-resistive random access memory (MRAM) comprising the device of claim 15.

24. A spintronic device, comprising:
    a bottom lead,
    a first layer disposed over the bottom lead, the first layer having a Seebeck coefficient, wherein the first layer is tapered such that a first surface of the first layer has a width that is shorter than a second width of a second surface of the first layer, the second surface opposite the first surface, and the first surface adjacent to the spintronic device;
    a spintronic oscillator (STO) disposed over the first layer, the spintronic oscillator having a width of about 10 nm to about 100 nm;

a second layer disposed over the STO, the second layer having a Seebeck coefficient, the Seebeck coefficient of the second layer being different from the Seebeck coefficient of the first layer; and a top lead disposed over the second layer, wherein the first layer and the second layer are positioned about the STO such that electrons flow from the layer having a higher Seebeck coefficient to the layer having a lower Seebeck coefficient when a current is applied to the spintronic device.

25. The device of claim 24, wherein a difference in Seebeck coefficient between the first layer and the second layer is about 5 µV/K or more.

26. The device of claim 25, wherein the difference in Seebeck coefficient between the first layer and the second layer is about 15 µV/K or more.

27. A magnetic recording device comprising a write head, the write head comprising the device of claim 24.

28. A magnetic recording device comprising a read head, the read head comprising the device of claim 24.

29. A magneto-resistive random access memory (MRAM) comprising the device of claim 24.

* * * * *